(12) United States Patent
Funaki et al.

(10) Patent No.: US 7,611,746 B2
(45) Date of Patent: Nov. 3, 2009

(54) ELECTROMAGNETIC-WAVE-SHIELDING LIGHT-TRANSMITTING WINDOW MEMBER AND METHOD FOR PRODUCING THE SAME

(75) Inventors: Tatsuya Funaki, Kodaira (JP); Hidefumi Kotsubo, Kodaira (JP); Kiyomi Sasaki, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 196 days.

(21) Appl. No.: 11/431,608

(22) Filed: May 11, 2006

(65) Prior Publication Data

US 2007/0036888 A1     Feb. 15, 2007

Related U.S. Application Data

(63) Continuation of application No. PCT/JP2004/016745, filed on Nov. 11, 2004.

(30) Foreign Application Priority Data

Nov. 14, 2003  (JP) .............................. 2003-385345
Nov. 14, 2003  (JP) .............................. 2003-385346
Nov. 14, 2003  (JP) .............................. 2003-385347

(51) Int. Cl.
  *B05D 5/12*   (2006.01)
  *C08F 2/48*   (2006.01)

(52) U.S. Cl. ...................... 427/96.3; 427/487; 427/508; 427/517

(58) Field of Classification Search ................ 427/96.3, 427/487, 508, 517
See application file for complete search history.

(56) References Cited

U.S. PATENT DOCUMENTS

| | | | |
|---|---|---|---|
| 5,942,371 A * | 8/1999 | Salvin et al. ............. | 430/280.1 |
| 6,737,496 B2 * | 5/2004 | Hodd et al. ................... | 528/32 |
| 6,846,564 B1 * | 1/2005 | Pascault et al. ............. | 428/402 |
| 7,144,927 B1 * | 12/2006 | Engelbrecht et al. .......... | 522/25 |
| 2005/0175819 A1 * | 8/2005 | Kobayashi et al. ........ | 428/195.1 |

FOREIGN PATENT DOCUMENTS

EP            0834898 A        4/1998

(Continued)

*Primary Examiner*—Elena T Lightfoot
(74) *Attorney, Agent, or Firm*—Sughrue Mion, PLLC

(57) ABSTRACT

A method for producing an electromagnetic-wave-shielding light-transmitting window member comprising a transparent substrate and a conductive pattern formed by electroless plating on a surface of the transparent substrate. In the method, an ultraviolet-curable resin paste containing an electroless plating catalyst is applied to a surface of a transparent substrate, and the resulting printed pattern is cured by irradiation of ultraviolet light to form a resin pattern. Subsequently, a plating layer is deposited on the resin pattern by electroless plating treatment to form a conductive pattern. The ultraviolet-curable resin paste is selected from a group of sublimable resists and phthalocyanine-based sublimable materials and contains a volatile substance that is volatized by heating or irradiation. By using the ultraviolet-curable resin paste, a good conductive pattern having excellent adhesion to the transparent substrate can be formed with high accuracy, efficiently, and at low cost.

5 Claims, 3 Drawing Sheets

FOREIGN PATENT DOCUMENTS

| | | | |
|---|---|---|---|
| EP | 1111982 A | 6/2001 |
| JP | 11-170420 A | 6/1999 |
| JP | 11-170421 | 6/1999 |
| JP | 2001303255 A * | 10/2001 |
| JP | 2002-185184 A | 6/2002 |
| JP | 2002-2223095 A | 9/2002 |
| JP | 2003-198185 A | 7/2003 |
| JP | 2003-304090 A | 10/2003 |
| JP | 2003304090 A | 10/2003 |
| JP | 2004-111822 A | 4/2004 |
| JP | 2004111822 A | 4/2004 |
| JP | 2004-277688 A | 10/2004 |
| JP | 2004277688 A | 10/2004 |
| WO | 03045127 A | 5/2003 |

* cited by examiner

US 7,611,746 B2

ELECTROMAGNETIC-WAVE-SHIELDING LIGHT-TRANSMITTING WINDOW MEMBER AND METHOD FOR PRODUCING THE SAME

CROSS REFERENCE TO RELATED APPLICATION

This is a continuation of International Patent Application of PCT/JP2004/016745 filed Nov. 11, 2004. The entire disclosure of the prior application is considered part of the disclosure of the accompanying continuation application and is hereby incorporated by reference.

FIELD OF THE INVENTION

The present invention relates to electromagnetic-wave-shielding light-transmitting window members useful, for example, as front filters for plasma display panels (PDPs) and window materials (e.g., patch films) for buildings requiring shielding from electromagnetic waves, such as hospitals, and also relates to methods for producing the same. In particular, the present invention relates to an electromagnetic-wave-shielding light-transmitting window member including a transparent substrate and a conductive pattern formed thereon by electroless plating, and a method for producing the same.

BACKGROUND OF THE INVENTION

In recent years, along with widespread use of OA equipment, communications equipment, and the like, problems associated with electromagnetic waves generated from such equipment have been receiving attention. There have been concerns that electromagnetic waves may have adverse effects on the human body, and also there have been occurrences of malfunction and the like of precision equipment caused by electromagnetic waves.

Electromagnetic-wave-shielding light-transmitting window members have been developed as front filters for PDPs in OA equipment and put into practical use. Such window members are also used in sites installed with precision equipment, such as hospitals and laboratories, to protect the precision equipment from electromagnetic waves generated from cellular phones and the like.

A known electromagnetic-wave-shielding light-transmitting window member mainly includes a conductive mesh member, such as a wire mesh, disposed between and integrated with transparent substrates, such as acrylic plates.

In general, conductive meshes used for known electromagnetic-wave-shielding light-transmitting window members have a wire diameter of 10 to 500 μm, a mesh size of about 5 to 500 mesh, and an open area ratio of less than 75%.

In the known conductive meshes which have been used, in general, conductive meshes composed of thicker conductive fibers are coarser while conductive meshes composed of thinner conductive fibers are finer. The reason for this is that although a coarse mesh can be produced with thick fibers, it is extremely difficult to produce a coarse mesh using thin fibers.

Accordingly, known electromagnetic-wave-shielding light-transmitting window members including such conductive meshes have a light transmittance of at most about 70%, and thus it is not possible to achieve satisfactory light transmittance, which is disadvantageous.

Furthermore, the known conductive meshes readily cause moire fringes (interference fringes) in connection with pixel pitches of light-emitting panels on which electromagnetic-wave-shielding light-transmitting window members are mounted, which is also disadvantageous.

In order to overcome such problems, formation of a conductive pattern using a pattern printing method has been proposed. For example, Japanese Unexamined Patent Application Publication No. 11-170420 proposes a method including forming a printed pattern on a surface of a transparent substrate using a paste containing an electroless plating catalyst, and depositing a conductive material on the printed pattern by electroless plating to form a conductive pattern. In pattern printing, it is possible to obtain a desired conductive pattern by forming a printed pattern containing an electroless plating catalyst into a desired shape and depositing a plating layer thereon. Thus, the pattern printing method allows a markedly high degree of freedom in designing the line width, spacing, and network shape compared with use of conductive meshes, and it is possible to easily form a lattice-like conductive pattern with thin lines and a high open area ratio, for example, at a line width of 200 μm or less and an open area ratio of 75% or more. In an electromagnetic-wave-shielding light-transmitting window member including such a coarse conductive pattern with thin lines, satisfactory light transmittance can be achieved and the moire phenomenon can be prevented. Here, the open area ratio is calculated from the mesh line width and the number of lines present per inch in width.

In the method described in Japanese Unexamined Patent Application Publication No. 11-170420, specifically, a printing paste which contains particles of an electroless plating catalyst, a resin component as a binder, a solvent, and other additives is pattern-printed, and after the resulting printed pattern is cured, a plating layer is deposited by electroless plating.

Japanese Unexamined Patent Application Publication No. 11-170421 describes a method including forming a pattern containing an electroless plating catalyst not by a printing method but by exposure through a photomask, and depositing a plating layer on the resulting pattern by electroless plating to form a conductive pattern.

In the method described in Japanese Unexamined Patent Application Publication No. 11-170420, since the plating layer is deposited by electroless plating on the printed pattern, it is necessary to blend particles of an electroless plating catalyst, at a high content, to a printing paste (i.e., high-content blending). Use of the printing paste including high-content blended catalyst particles gives rise to the following problems:

(1) Since a large amount of catalyst particles is contained, it is difficult to adjust the viscosity of the printing paste, resulting in difficulty in forming a micropattern with high accuracy.

(2) Since a large amount of catalyst particles is contained, the amount of the resin component which is a binder is relatively small, and in some cases, adhesion between the transparent substrate and the printed pattern, and further adhesion with the conductive pattern, may be degraded.

(3) Since the catalyst particles are expensive, the increase in the blending amount thereof leads to soaring of the material cost.

In the method described in Japanese Unexamined Patent Application Publication No. 11-170420, even if the particles of the electroless plating catalyst are blended at a high content to the printing paste, unless the particles of the catalyst are exposed to the surface of the printed pattern formed by pattern printing, it is not possible to deposit a plating layer by electroless plating on the surface of the printed pattern.

In the method according to Japanese Unexamined Patent Application Publication No. 11-170420, by increasing the ratio of the catalyst particles to the binder to a certain degree, the catalyst particles are exposed after pattern printing. In such a printing paste, in order to achieve a viscosity suitable for printing, a considerable amount of a solvent must be added. In the printing paste containing the solvent, a heat drying process is necessary after printing, and dripping during heating and a length of tact time (heating time) can cause problems for operation.

Examples of the resin include a thermosetting resin which is cured by heating and an ultraviolet-curable resin which is cured by irradiation of ultraviolet light. The ultraviolet-curable resin is advantageous in that the curing rate is high and productivity is high. In the method according to Japanese Unexamined Patent Application Publication No. 11-170421 in which a photoresist process is employed, an ultraviolet-curable resin is used. When an ultraviolet-curable resin containing particles of an electroless plating catalyst is cured by irradiation of ultraviolet light, a part of the ultraviolet light applied is absorbed by the catalyst particles. Therefore, the irradiation efficiency of ultraviolet light is low, and the curing efficiency of the resin is low. In particular, inner layers are not easily cured. This problem becomes more conspicuous when the catalyst particles are blended at a high content. In order to prevent the catalyst particles from absorbing ultraviolet light, it is necessary to select catalyst particles with high transmittance with respect to ultraviolet light. In such a case, catalyst species that can be used are restricted.

SUMMARY OF THE INVENTION

Objects of the present invention are to provide a method for producing an electromagnetic-wave-shielding light-transmitting window member in which a printing paste is cured by irradiation of ultraviolet light, thus eliminating the problems of dripping during heating and tact time, and in which the blending amount of particles of an electroless plating catalyst in the plating paste can be decreased, thus alleviating the problems (1) to (3) described above due to high-content blending of the catalyst particles and the problem of absorption of ultraviolet light in the case of ultraviolet curing; and to provide an electromagnetic-wave-shielding light-transmitting window member produced by the method.

According to a first aspect of the present invention, in a method for producing an electromagnetic-wave-shielding light-transmitting window member including a transparent substrate and a conductive pattern formed by electroless plating on a surface of the transparent substrate, the method includes the steps of applying, by printing, an ultraviolet-curable resin paste containing an electroless plating catalyst to the surface of the transparent substrate, curing the resulting printed pattern by irradiation of ultraviolet light to form a resin pattern having the same pattern as the conductive pattern, and depositing a conductive material on the resin pattern by electroless plating treatment to form the conductive pattern, wherein the resin pattern to be subjected to the electroless plating treatment has an uncured layer provided on a surface thereof.

According to a second aspect of the present invention, in a method for producing an electromagnetic-wave-shielding light-transmitting window member including a transparent substrate and a conductive pattern formed by electroless plating on a surface of the transparent substrate, the method includes the steps of applying, by printing, an ultraviolet-curable resin paste containing an electroless plating catalyst to the surface of the transparent substrate, curing the resulting printed pattern by irradiation of ultraviolet light to form a resin pattern having the same pattern as the conductive pattern, and depositing a conductive material on the resin pattern by electroless plating treatment to form the conductive pattern, wherein the ultraviolet-curable resin paste contains a volatile substance that is volatilized or generates a volatile component by heating or irradiation of ultraviolet light, after the resin pattern is formed, the volatile component is volatilized from the resin pattern to expose particles of the electroless plating catalyst to the surface of the resin pattern, and then the electroless plating treatment is carried out.

According to a third aspect of the present invention, in a method for producing an electromagnetic-wave-shielding light-transmitting window member including a transparent substrate and a conductive pattern formed by electroless plating on a surface of the transparent substrate, the method includes the steps of applying, by printing, an ultraviolet-curable resin paste containing an electroless plating catalyst to the surface of the transparent substrate, curing the resulting printed pattern by irradiation of ultraviolet light to form a resin pattern having the same pattern as the conductive pattern, and depositing a conductive material on the resin pattern by electroless plating treatment to form the conductive pattern, wherein the ultraviolet-curable resin paste contains a resin component soluble in an electroless plating bath and/or a resin component capable of being impregnated with the electroless plating bath, thereby particles of the electroless plating catalyst are exposed to the surface of the resin pattern during the electroless plating treatment. (In the third aspect, the resin component soluble in the electroless plating bath and/or the resin component capable of being impregnated with the electroless plating bath is hereinafter referred to as the "erosive resin component".)

An electromagnetic-wave-shielding light-transmitting window member according to the present invention is produced by any of the production methods for the electromagnetic-wave-shielding light-transmitting window members of the present invention described above.

BRIEF DESCRIPTION OF THE DRAWINGS

[FIG. 1]

[FIG. 2]

[FIG. 3]

DESCRIPTION OF THE PREFERRED EMBODIMENTS

[1] First, an electromagnetic-wave-shielding light-transmitting window member and a method for producing the same according to a preferred embodiment of the first aspect will be described with reference to FIGS. 1a to 1e.

FIG. 1 shows cross-sectional views illustrative of a method for producing an electromagnetic-wave-shielding light-transmitting window member according to the present invention.

Figure 1A:
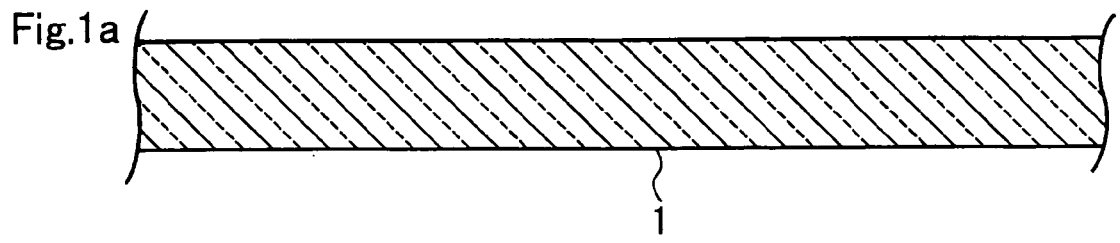
FIGS. 1a to 1e are schematic cross-sectional views showing a method for producing an electromagnetic-wave-shielding light-transmitting window member according to an embodiment of the first aspect.
Figure 1B:
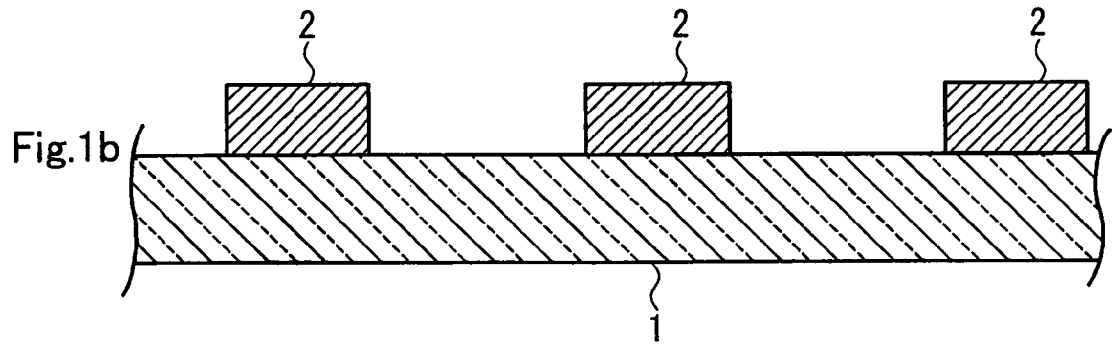
Figure 1C:
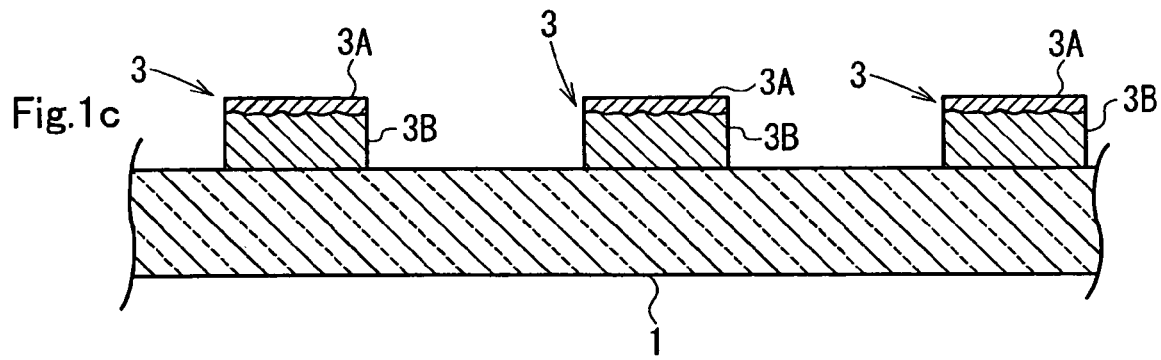

First, a transparent substrate 1 is prepared (FIG. 1a), and a printed pattern 2 composed of an ultraviolet-curable resin paste is formed on a surface of the transparent substrate 1 by a printing method (FIG. 1b). Subsequently, the printed pattern 2 is irradiated with ultraviolet light to cure a lower portion of the printed pattern 2 excluding a surface portion so that an uncured layer 3A remains in the surface portion (FIG. 1c).

Figure 1D:
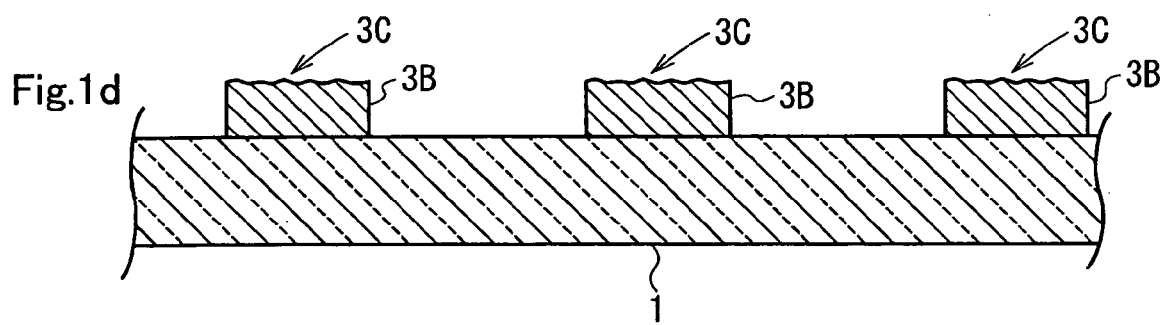
Figure 1E:
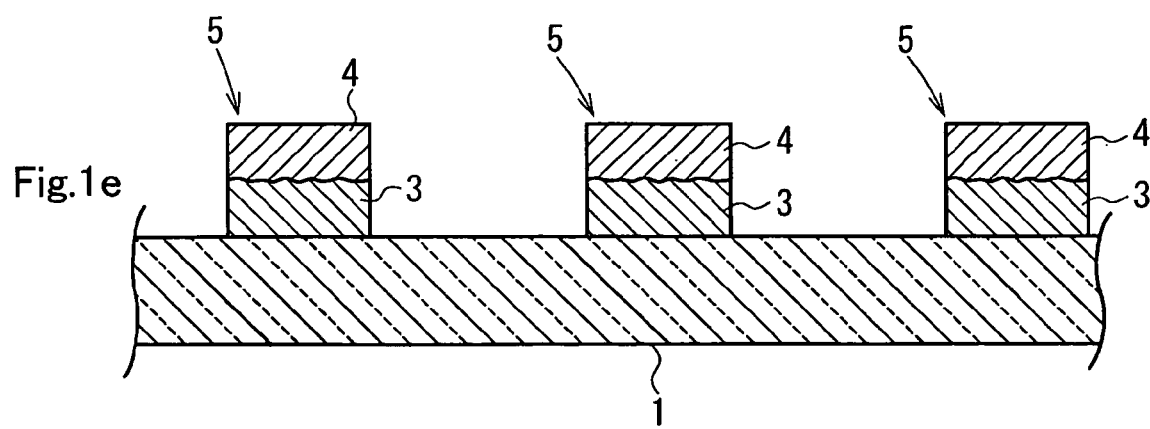

The transparent substrate 1 provided with a resin pattern 3 having the uncured layer 3A in the surface portion is subjected to electroless plating treatment. In the electroless plating treatment, when the transparent substrate 1 is immersed in a plating bath, the uncured layer 3A on the surface of the resin pattern 3 is eroded in the plating bath. Particles of an electroless plating catalyst contained in the ultraviolet-curable resin paste are exposed to a surface 3C of a cured layer 3B after the uncured layer 3A has been eroded and removed (FIG. 1d). An electroless plating layer 4 is formed, using the exposed catalyst particles as nuclei, on the surface 3C to be plated to which the catalyst particles have been exposed (FIG. 1e). Thereby, an electromagnetic-wave-shielding light-transmitting window member in which a conductive pattern 5 is disposed on the transparent substrate 1 is obtained.

As a constituent material of the transparent substrate 1, any material that has excellent erosion resistance to the plating bath and excellent adhesion to the ultraviolet-curable resin paste may be used without particular limitations. Examples thereof include glass, polyesters, polyethylene terephthalate (PET), polybutylene terephthalate, polymethyl methacrylate (PMMA), acrylic plates, polycarbonate (PC), polystyrene, triacetate films, polyvinyl alcohol, polyvinyl chloride, polyvinylidene chloride, polyethylene, ethylene-vinyl acetate copolymers, polyvinyl butyral, metal ion crosslinked ethylene-methacrylic acid copolymers, polyurethanes, and cellophane. Particularly preferred are PET, PC, and PMMA.

The thickness of the transparent substrate 1 may be appropriately determined depending on the properties (e.g., strength and lightweightness) required in the application of the resulting window member, and is usually in a range of 1 µm to 5 mm. As the transparent substrate 1, a transparent film with a thickness of about 25 to 200 µm is preferable in view of the reduction in the thickness and weight of the electromagnetic-wave-shielding light-transmitting window member.

The ultraviolet-curable resin paste contains a resin component as a binder, particles of an electroless plating catalyst, and a photoinitiator. The resin component is preferably an alkali-resistant resin component that ensures adhesion to the transparent substrate 1 and that has excellent erosion resistance to the electroless plating bath after being cured, and particularly preferably a reactive acrylate and/or methacrylate. The resin component may be a monomer or an oligomer. Preferably, the blending amounts of the monomer and the oligomer and the molecular weight of the oligomer are appropriately adjusted depending on the viscosity required in the ultraviolet-curable resin paste.

As the particles of the electroless plating catalyst, particles of a noble metal, such as Pd, Au, Ag, or Pt; particles of a metal, such as Cu; or particles of a metal oxide, such as ITO (indium tin oxide), may be used. One type of these catalyst particles may be used alone, or two or more types may be combined for use.

The blending amount of the catalyst particles may be appropriately determined depending on the type of the catalyst particles used, and in general, is 10 to 700 parts by weight based on 100 parts by weight of the resin component. Among the catalyst particles, the required amount of Pd is low, for example, about 10 to 50 parts by weight based on 100 parts by weight of the resin component, thus being advantageous in terms of the reduction in the blending amount of the catalyst particles.

If the particle size of the catalyst particles is large, a homogeneous plating layer cannot be obtained. Therefore, the catalyst particles are preferably fine particles with a particle size of 1 µm or less, and in particular, 0.1 µm or less, for example, with an average particle size of about 5 to 500 nm.

As the photoinitiator, preferred is a photoinitiator having an oxygen inhibitory effect, i.e., a photoinitiator which captures oxygen and is altered, thereby degrading its photoinitiating ability.

In the first aspect, as described above, the printed pattern 2 made of the ultraviolet-curable resin paste is irradiated with ultraviolet light so that the uncured layer 3A remains on the surface. Examples of the method for curing the printed pattern 2 made of the ultraviolet-curable resin paste so that the uncured layer 3A remains on the surface include a method in which the conditions for curing by irradiation of ultraviolet light are controlled, a method in which the composition and the compositional ratio of the ultraviolet-curable resin paste are adjusted, and a mixture of these methods. Among them, particularly preferably, a photoinitiator having an oxygen inhibitory effect is used, and the photoinitiator present in the surface portion of the printed pattern is degraded by oxygen in the atmosphere, thus preventing the surface portion from being cured to form an uncured layer.

In such a case, preferably, prior to the ultraviolet irradiation of the printed pattern formed on the transparent substrate, by exposure to an oxygen atmosphere or air or by performing ultraviolet irradiation in an oxygen atmosphere or in air, the photoinitiator in the surface portion is degraded by oxidation. In such a case, by appropriately controlling the conditions for exposure to oxygen (time and oxygen concentration), the degree of degradation of the photoinitiator in the surface layer can be controlled, and the thickness and the like of the remaining uncured layer can be controlled.

Examples of the photoinitiator having an oxygen inhibitory effect include acylphosphine oxide photoinitiators, such as monoacylphosphine oxide and bisacylphosphine oxide. The blending amount of the photoinitiator in the ultraviolet-curable resin paste is appropriately determined depending on the type of the photoinitiator used, the required ability of curing the inner portion, and the required ability of allowing the surface to be uncured, and is usually 2 to 10 parts by weight, for example, about 3 to 4 parts by weight, based on 100 parts by weight of the resin component.

As necessary, the ultraviolet-curable resin paste may contain, in addition to the components described above, a dispersing agent, such as a surfactant, in an amount of 0 to about 10 parts by weight based on 100 parts by weight of the resin component.

As necessary, the ultraviolet-curable resin paste may contain a solvent to adjust the viscosity. The amount of the solvent is preferably 0 to about 50 parts by weight based on 100 parts by weight of the resin component. Although a solventless ultraviolet-curable resin paste that includes substantially no solvent can be prepared, a solvent may be used. Even when a solvent is used, it is possible to reduce the blending amount thereof compared with a known general printing paste. Thereby, it is possible to overcome the problems of heat drying treatment after printing, dripping during heating, and tact time (heating time).

As the printing method for applying the ultraviolet-curable resin paste onto the transparent substrate, a screen printing method, an offset printing method, a gravure printing method, a flexographic printing method, or the like may be employed although not limited thereto.

Prior to printing, the ultraviolet-curable resin paste prepared is preferably sieved with a mesh having an adequate opening size to eliminate coarse particles or the like.

The conditions for ultraviolet irradiation to the resulting printed pattern are not particularly limited. The ultraviolet irradiation is performed by an ordinary method under the conditions that allow the uncured layer to remain on the surface. In particular, when a photoinitiator having an oxygen inhibitory effect is used as the photoinitiator in the ultraviolet-curable resin paste, by increasing the oxygen concentration in the atmosphere during the ultraviolet irradiation, an uncured layer can be allowed to selectively remain in the surface layer, thus being preferable. In such a case, the oxygen concentration in the atmosphere is equal to or higher than that in the air, and preferably, an oxygen atmosphere is used.

It is necessary to set the thickness of the uncured layer at a certain value or more in order to expose a sufficient amount of the catalyst particles by allowing the uncured layer to remain and by eroding the uncured layer in the subsequent plating treatment. If the thickness of the uncured layer is excessively large, the thickness of the cured layer becomes relatively small, and thus the resin pattern fails to function as a base layer for the plating layer. Preferably, the thickness of the printed pattern 2 formed by printing is 0.1 to 30 µm, the thickness of the cured layer 3B obtained by ultraviolet irradiation is 0.1 to 15 µm, and the thickness of the remaining uncured layer is 0.01 to 0.1 µm. In particular, the thickness of the uncured layer is preferably 50% or less of the thickness of the printed pattern 2.

After ultraviolet curing is performed so as to allow the uncured layer 3A to remain, electroless plating treatment is performed. The electroless plating treatment can be performed by an ordinary method using a usual electroless plating bath. Preferred examples of the plating metal, i.e., the conductive material constituting the conductive pattern 5, include metals, such as aluminum, nickel, indium, chromium, gold, vanadium, tin, cadmium, silver, platinum, copper, titanium, cobalt, and zinc, and alloys thereof. Among them, particularly preferred are pure metals of copper, nickel, chromium, zinc, tin, silver, and gold, and alloys thereof. Examples of the electroless plating bath that can be used include an electroless Cu plating bath, an electroless Ni—P plating bath, an electroless Ni—B plating bath, and an electroless Au plating bath.

By the electroless plating treatment, the uncured layer 3A of the resin pattern 3 is eroded to reveal the cured layer 3B, the plating metal is deposited using, as nuclei, the particles of the electroless plating catalyst exposed to the surface 3C of the revealed cured layer 3B, and thereby the plating layer 4 is formed.

If the thickness of the plating layer 4 of the conductive pattern 5 thus formed is excessively small, the electromagnetic-wave-shielding property is insufficient, which is not desirable. If the thickness of the plating layer 4 is excessively large, the thickness of the resulting electromagnetic-wave-shielding light-transmitting window member is affected, and the angle of view is narrowed. Furthermore, since the plating extends also in the width length, the line width increases, resulting in a decrease in the open area ratio. The thickness of the plating layer 4 is preferably about 0.1 to 10 µm.

After the conductive pattern 5 is formed by electroless plating, in order to impart anti-glare properties, blackening treatment may be performed. Examples of the blackening technique that may be used include oxidation treatment for the metal film and black plating treatment using a chromium alloy or the like.

Desirably, the conductive pattern 5 thus formed has a lattice shape having a line width of preferably 200 µm or less, particularly preferably 100 µm or less, and most preferably 30 µm or less, and an open area ratio of 75% or more. Consequently, the ultraviolet-curable resin paste is preferably pattern-printed so that such a conductive pattern 5 can be formed.

In particular, when a transparent film is used as the substrate, the electromagnetic-wave-shielding light-transmitting window member thus produced may be a sheet film or a continuous web film wound off a roll.

In the first aspect, the resin pattern obtained by ultraviolet irradiation of the printed pattern composed of the ultraviolet-curable resin paste, which is subjected to electroless plating, is provided with an uncured layer on the surface thereof. Therefore, during the electroless plating treatment, the uncured layer is eroded in the plating bath, and the catalyst particles are exposed. A satisfactory plating layer can be formed by electroless plating using the exposed catalyst particles as nuclei.

The printing paste may be of a solventless type, and thus the problems of dripping during heating and tact time resulting from heating treatment when a solvent is used can be overcome.

Since the surface layer of the resin pattern is eroded in the plating bath to force catalyst particles to be exposed, even if the amount of blending of the catalyst particles is decreased, electroless plating treatment can be performed efficiently, and the problems that may be caused by high-content blending of catalyst particles are eliminated or alleviated.

Accordingly, the following advantages can be obtained.

(1) The viscosity of the printing paste can be adjusted easily, and a micropattern can be formed with high accuracy.

(2) The amount of the resin component which is a binder can be increased, and thus adhesion between the transparent substrate and the printed pattern, and further adhesion with the conductive pattern can be improved..

(3) The material cost can be reduced by decreasing the amount of blending of expensive catalyst particles.

(4) By decreasing the amount of blending of catalyst particles, the amount of ultraviolet light absorbed by the catalyst particles can be decreased, and thus the irradiation efficiency of ultraviolet light and the curing efficiency can be increased.

As described above, according to the first aspect, when an electromagnetic-wave-shielding light-transmitting window member is produced by a method including the steps of applying, by printing, a resin paste containing an electroless plating catalyst to the surface of a transparent substrate, curing the resulting printed pattern to form a resin pattern, and depositing a plating layer on the resin pattern by electroless plating to form a conductive pattern, by using an ultraviolet-curable resin paste, a good conductive pattern having excellent adhesion to the transparent substrate can be formed with high accuracy, efficiently, and at low cost. The conductive pattern follows the printed pattern, and it is possible to form a conductive pattern with a small line width and a high open area ratio. Therefore, it is possible to easily produce an electromagnetic-wave-shielding light-transmitting window member in which the moire phenomenon can be prevented, and which has significantly high light transmittance, electromagnetic-wave-shielding properties, and heat ray (near-infrared ray) blocking properties.

The first aspect will be described more specifically with reference to examples and comparative examples.

Examples 1 to 3 and Comparative Examples 1 to 3

First, at the composition shown in Table 1, an acrylate oligomer, an acrylate monomer, and a photoinitiator were stirred for 30 minutes, and then defoaming was performed. Subsequently, palladium fine particles, as electroless plating catalyst particles, were added thereto, and stirring was performed with a bead mill. Then, kneading was performed with a triple roll mill, and filtering was performed with a #300 mesh to prepare a solventless ultraviolet-curable resin paste.

The resulting ultraviolet-curable resin paste was applied by screen printing onto a transparent PET film (100 μm thick), and curing was performed in an atmosphere shown in Table 1 at an irradiation intensity of 125 mW and an integrated amount of light of 1,000 mJ. Thereby, a resin pattern with a predetermined lattice pattern (line width: 20 μm, line spacing: 230 μm, thickness: 3 μm) was formed. The thickness of an uncured layer in the surface portion of the resulting resin pattern was measured and the result thereof is shown in Table 1.

The PET film on which the resin pattern was thus formed was immersed in an electroless copper plating bath ("Cu 5100" manufactured by Meltex Inc.) and electroless copper plating treatment was performed at 50° C. for 20 minutes to form a conductive pattern.

With respect to the resulting conductive pattern, deposition of plating and adhesion were evaluated by the methods described below, and the results thereof are shown in Table 1.

Deposition of plating: The thickness of the plating layer was checked, and also by visually observing the plating layer, the plating layer was evaluated under the following criteria: very homogeneous (⊙), homogeneous (○), slightly inhomogeneous (Δ), and inhomogeneous (x).

Figure 2A:
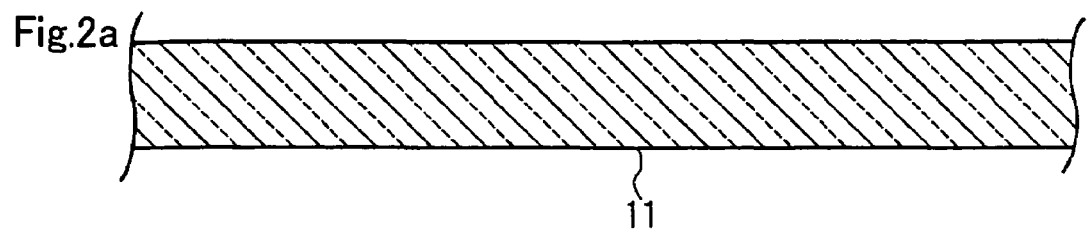
FIGS. 2a to 2e are schematic cross-sectional views showing a method for producing an electromagnetic-wave-shielding light-transmitting window member according to an embodiment of the second aspect.
Figure 2B:
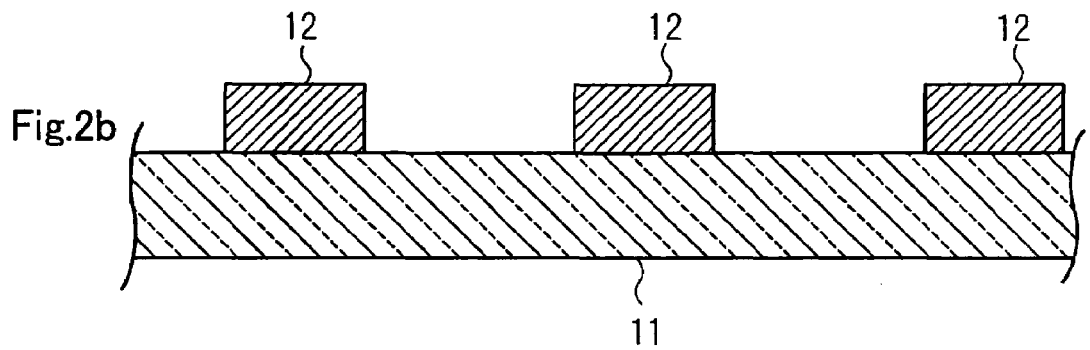
Figure 2C:
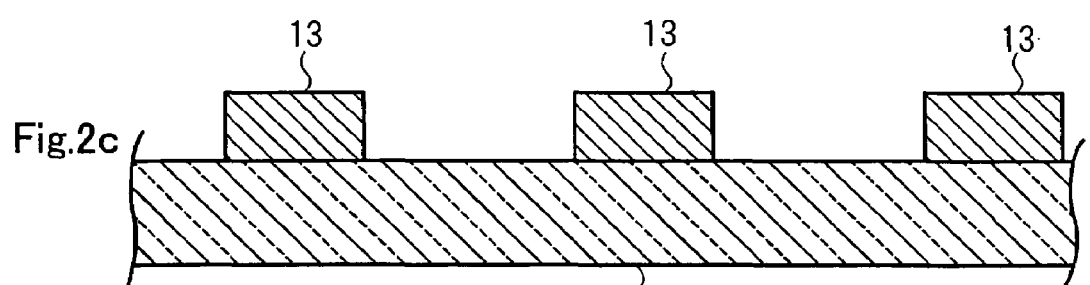

Adhesion of conductive pattern: By a scotch tape peeling test, the adhesion was evaluated under the following criteria: very good (⊙), good (○), and poor (x).

a printing method (FIG. 2b). Subsequently, the printed pattern 12 is cured by irradiation of ultraviolet light to form a resin pattern 13 (FIG. 2c).

Figure 2D:
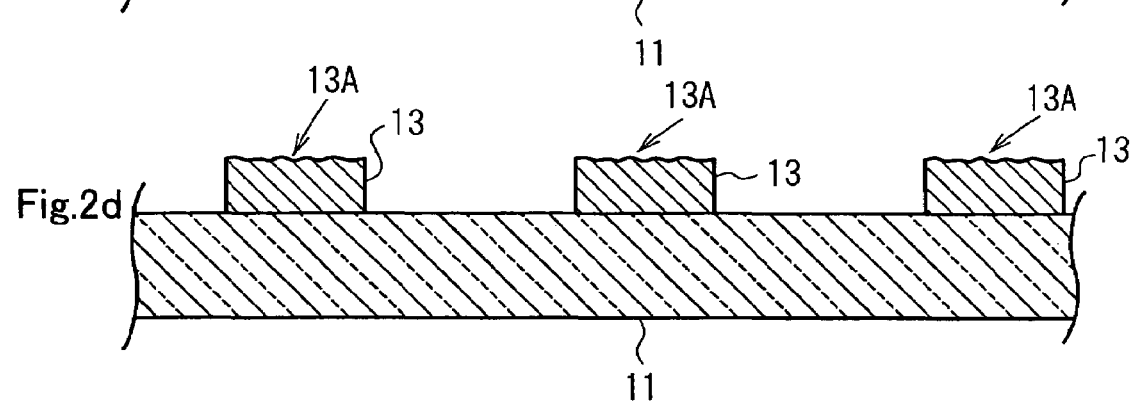
Figure 2E:
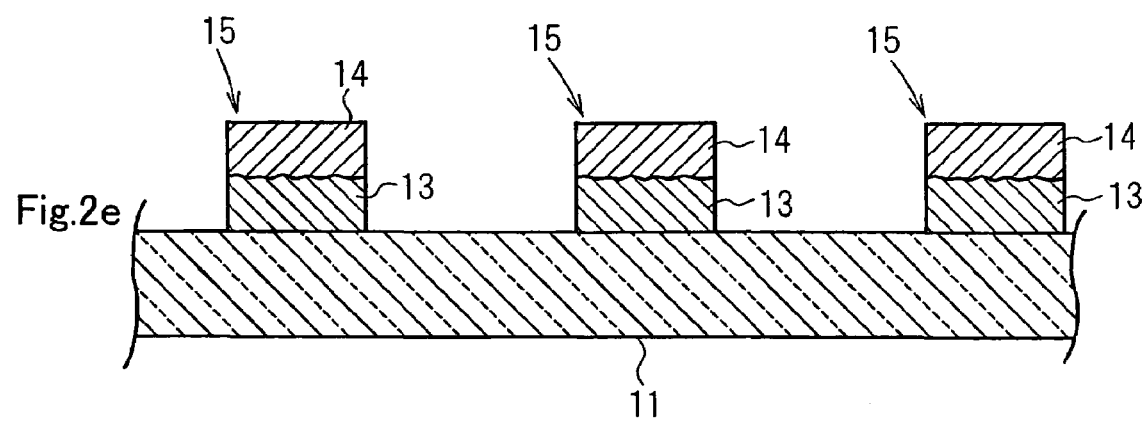

After the resin pattern 13 is formed, a volatile component is volatilized from a volatile substance contained in the resin pattern 13 by heating the resin pattern 13 or the like (FIG. 2d). A surface 13A of the resin pattern 13 is roughened by the volatilization of the volatile component, and catalyst particles contained in the ultraviolet-curable resin paste are exposed. By performing electroless plating treatment in such a state, an electroless plating layer 14 is formed, using the exposed catalyst particles as nuclei, on the surface 13A to which the catalyst particles have been exposed (FIG. 2e). Thereby, an electromagnetic-wave-shielding light-transmitting window member in which a conductive pattern 15 is disposed on the transparent substrate 11 is obtained.

As a constituent material of the transparent substrate 11, any material that has excellent erosion resistance to the plating bath and excellent adhesion to the ultraviolet-curable resin paste may be used without particular limitations. Examples thereof include glass, polyesters, polyethylene terephthalate (PET), polybutylene terephthalate, polymethyl methacrylate (PMMA), acrylic plates, polycarbonate (PC), polystyrene, triacetate films, polyvinyl alcohol, polyvinyl chloride, polyvinylidene chloride, polyethylene, ethylene-vinyl acetate copolymers, polyvinyl butyral, metal ion

TABLE 1

|  |  | Example | | | Comparative Example | | |
| --- | --- | --- | --- | --- | --- | --- | --- |
|  |  | 1 | 2 | 3 | 1 | 2 | 3 |
| Composition of solventless | Acrylate oligomer *1 | 100 | 100 | 100 | 100 | 100 | 100 |
| ultraviolet-curable resin | Acrylate monomer A *2 | 100 | 100 |  | 100 |  |  |
| paste | Acrylate monomer B *3 |  |  | 100 |  | 100 | 100 |
| (Part by weight) | Photoinitiator A *4 | 6 | 6 | 6 | 6 | 6 |  |
|  | Photoinitiator B *5 |  |  |  |  |  | 6 |
|  | Palladium fine particles *6 | 20 | 20 | 20 | 20 | 20 | 20 |
| Atmosphere for ultraviolet irradiation |  | Oxygen | Air | Air | Nitrogen | Nitrogen | Air |
| Thickness of uncured layer (μm) |  | 0.1 | 0.1 | 0.1 | 0 | 0 | 0 |
| Deposition of plating | Thickness of plating layer (μm) | 10 | 10 | 10 | 10 | 1 | 2 |
|  | Homogeneity of plating layer | ⊙ | ○ | ○ | Δ | Δ | Δ |
| Adhesion of conductive pattern |  | ⊙ | ⊙ | ⊙ | ⊙ | ⊙ | ⊙ |

*1: Acrylate oligomer "UV 2000B" manufactured by Nippon Kayaku Co., Ltd.
*2: Acrylate monomer (morpholine acrylate) "Rm 1001" manufactured by Nippon Kayaku Co., Ltd.
*3: Acrylate monomer (2-hydroxy-3-phenoxypropyl acrylate) "R 561" manufactured by Nippon Kayaku Co., Ltd.
*4: Bisacylphosphine oxide photoinitiator (oxygen inhibitory effect) "IRGACUR 819" (bis(2,4,6-trimethylbenzoyl)-phenylphosphine oxide) manufactured by Ciba Specialty Chemicals
*5: a-Aminoketone type photoinitiator (weak oxygen inhibitory effect) "IRGACUR 907" (2-methyl-1[4-(methylthio)phenyl]-2-morpholinopropan-1-one) manufactured by Ciba Specialty Chemicals
*6: Palladium fine particles "AY 4030" manufactured by Takana Kikinzoku Kogyo KK (Average particle size: about 0.1 mm)

As is evident from Table 1, it is possible to form a good conductive pattern by subjecting a resin pattern which has been cured by ultraviolet light so that an uncured layer can remain in the surface portion according to the first aspect.

[2] Next, an electromagnetic-wave-shielding light-transmitting window member and a method for producing the same according to a preferred embodiment of the second aspect will be described with reference to FIGS. 2a to 2e.

First, a transparent substrate 11 is prepared (FIG. 2a), and a printed pattern 12 composed of an ultraviolet-curable resin paste is formed on a surface of the transparent substrate 11 by crosslinked ethylene-methacrylic acid copolymers, polyurethanes, and cellophane. Particularly preferred are PET, PC, and PMMA.

The thickness of the transparent substrate 11 may be appropriately determined depending on the properties (e.g., strength and lightweightness) required in the application of the resulting window member, and is usually in a range of 1 μm to 5 mm. As the transparent substrate 11, a transparent film with a thickness of about 25 to 200 μm is preferable in view of the reduction in the thickness and weight of the electromagnetic-wave-shielding light-transmitting window member.

The ultraviolet-curable resin paste contains a resin component as a binder, particles of an electroless plating catalyst, a photoinitiator, and a volatile substance. The resin component is preferably an alkali-resistant resin component that ensures adhesion to the transparent substrate 11 and that has excellent erosion resistance to the electroless plating bath after being cured, and particularly preferably a reactive acrylate and/or methacrylate. The resin component may be a monomer or an oligomer. Preferably, the blending amounts of the monomer and the oligomer and the molecular weight of the oligomer are appropriately adjusted depending on the viscosity required in the ultraviolet-curable resin paste.

As the particles of the electroless plating catalyst, particles of a noble metal, such as Pd, Au, Ag, or Pt; particles of a metal, such as Cu; or particles of a metal oxide, such as ITO (indium tin oxide), may be used. One type of these catalyst particles may be used alone, or two or more types may be combined for use.

The blending amount of the catalyst particles may be appropriately determined depending on the type of the catalyst particles used, and in general, is 10 to 700 parts by weight based on 100 parts by weight of the resin component. Among the catalyst particles, the required amount of Pd is low, for example, about 5 to 50 parts by weight based on 100 parts by weight of the resin component, thus being advantageous in terms of the reduction in the blending amount of the catalyst particles.

If the particle size of the catalyst particles is large, a homogeneous plating layer cannot be obtained. Therefore, the catalyst particles are preferably fine particles with a particle size of 1 µm or less, and in particular, 0.1 µm or less, for example, with an average particle size of about 5 to 500 nm.

The photoinitiator is not particularly limited, and any photoinitiator that is usually employed for ultraviolet-curable resins may be suitably used.

The blending amount of the photoinitiator in the ultraviolet-curable resin paste may be appropriately determined depending on the type of the photoinitiator used and the required ability of curing. When a volatile substance is used separately from the photoinitiator, the blending amount of the photoinitiator is usually 2 to 10 parts by weight, for example, about 3 to 4 parts by weight, based on 100 parts by weight of the resin component.

When a volatile photoinitiator, such as an α-aminoketone, is used as the photoinitiator, at the blending amount of the ordinary photoinitiator, it is not possible to release the volatile component sufficiently for exposing the catalyst particles to the surface of the resin pattern. Consequently, in such a case, the volatile photoinitiator is preferably blended in an amount of 3 to 20 parts by weight based on 100 parts by weight of the resin component.

Specific examples of the volatile photoinitiator include MMMP (2-methyl-1[4-(methylthio)phenyl]-2-morpholino-propan-l-one) and BDMB (2-benzyl-2-dimethylamino-1-(4-morpholinophenyl)-butanone-1).

As the volatile substance, any substance that is volatilized or generates a volatile component by heating or irradiation of ultraviolet light may be used without particular limitations. Examples of the volatile substance other than the volatile photoinitiator include the followings:

(1) Sublimable material

Sublimation at room temperature or by heating: camphor, naphthalene, benzoic acid, salicylic acid, menthol, etc.

Sublimation due to light: sublimable resists, phthalocyanine-based sublimable materials (2) Foaming substance: camphor, benzoic acid, salicylic acid, expandable urethane, etc.

(3) Low boiling point liquid: solvents with a boiling point of 100° C. or less, e.g., lower alcohols, such as ethanol, ethyl acetate, diethyl ether, THF, etc.

The volatile substances may be used alone or in combination of two or more.

The blending amount of the volatile substance other than the volatile photoinitiator in the ultraviolet-curable resin paste depends on the type of the volatile substance used. If the amount of the volatile substance is excessively small, the catalyst particle-exposing effect brought by the use of the volatile substance cannot be obtained, and it is not possible to form a homogeneous plating layer by electroless plating. If the blending amount of the volatile substance is excessively large, adhesion between the substrate and the resin pattern is degraded. The blending amount of the volatile substance other than the low boiling point solvent is preferably 10 to 100 parts by weight, and particularly preferably 10 to 50 parts by weight, based on 100 parts by weight of the resin component in the ultraviolet-curable resin paste. Among the volatile substances, the blending amount of the low boiling point solvent is preferably 3 to 10 parts by weight based on 100 parts by weight of the resin component in the ultraviolet-curable resin paste.

The volatile photoinitiator and the volatile substance may be used together.

As necessary, the ultraviolet-curable resin paste may contain, in addition to the components described above, a dispersing agent, such as a surfactant, in an amount of 0 to about 10 parts by weight based on 100 parts by weight of the resin component.

As necessary, the ultraviolet-curable resin paste may contain a solvent to adjust the viscosity. The amount of the solvent is preferably 0 to about 50 parts by weight based on 100 parts by weight of the resin component (the amount of the solvent including that of a low boiling point solvent if the low boiling point solvent is used as the volatile substance). Although a solventless ultraviolet-curable resin paste that includes substantially no solvent can be prepared, a solvent may be used. Even when a solvent is used, it is possible to reduce the blending amount thereof compared with a known general printing paste. Thereby, it is possible to overcome the problems of heat drying treatment after printing, dripping during heating, and tact time (heating time).

As the printing method for applying the ultraviolet-curable resin paste onto the transparent substrate, a screen printing method, an offset printing method, a gravure printing method, a flexographic printing method, or the like may be employed although not limited thereto.

Prior to printing, the ultraviolet-curable resin paste prepared is preferably sieved with a mesh having an adequate opening size to eliminate coarse particles or the like.

The conditions for ultraviolet irradiation to the resulting printed pattern are not particularly limited, and ultraviolet irradiation is performed according to an ordinary method. After ultraviolet irradiation, treatment, such as heating, is performed as needed to volatilize the volatile substance in the resin pattern.

The heating treatment is usually performed at 40° C. to 80° C. for about 10 to 60 minutes although it depends on the type of the volatile substance used. Preferably, heating is performed from the front side. Even if such heating is performed, since the resin pattern has already been cured, problems, such as dripping, do not occur, and the processing task is not greatly affected.

After ultraviolet curing and, as needed, heating treatment are performed, electroless plating treatment is performed. The electroless plating treatment can be performed by an ordinary method using a usual electroless plating bath. Preferred examples of the plating metal, i.e., the conductive material constituting the conductive pattern 15, include metals, such as aluminum, nickel, indium, chromium, gold, vanadium, tin, cadmium, silver, platinum, copper, titanium, cobalt, and zinc, and alloys thereof. Among them, particularly preferred are pure metals of copper, nickel, chromium, zinc, tin, silver, and gold, and alloys thereof. Examples of the electroless plating bath that can be used include an electroless Cu plating bath, an electroless Ni—P plating bath, an electroless Ni—B plating bath, and an electroless Au plating bath.

By the electroless plating treatment, the plating metal is deposited using the electroless plating catalyst particles as nuclei, the catalyst particles being exposed to the surface 13A by the volatilization of the volatile component from the resin pattern 13, and thereby the plating layer 14 is formed.

If the thickness of the plating layer 14 of the conductive pattern 15 thus formed is excessively small, the electromagnetic-wave-shielding property is insufficient, which is not desirable. If the thickness of the plating layer 14 is excessively large, the thickness of the resulting electromagnetic-wave-shielding light-transmitting window member is affected, and the angle of view is narrowed. Furthermore, since the plating extends also in the width length, the line width increases, resulting in a decrease in the open area ratio. The thickness of the plating layer 14 is preferably about 0.1 to 10 μm.

After the conductive pattern 15 is formed by electroless plating, in order to impart anti-glare properties, blackening treatment may be performed. Examples of the blackening technique that may be used include oxidation treatment for the metal film and black plating treatment using a chromium alloy or the like.

Desirably, the conductive pattern 15 thus formed has a lattice shape having a line width of, preferably 200 μm or less, particularly preferably 100 μm or less, and most preferably 30 μm or less, and an open area ratio of 75% or more. Consequently, the ultraviolet-curable resin paste is preferably pattern-printed so that such a conductive pattern 15 can be formed.

In particular, when a transparent film is used as the substrate, the electromagnetic-wave-shielding light-transmitting window member thus produced may be a sheet film or a continuous web film wound off a roll.

In the second aspect, the ultraviolet-curable resin paste contains a volatile substance that is volatilized or generates a volatile component by heating or irradiation of ultraviolet light. Consequently, after the printed pattern made of the ultraviolet-curable resin paste is cured, by volatizing the volatile component from the resulting resin pattern, the surface of the resin pattern is roughened to expose the catalyst particles. Using the exposed catalyst particles as nuclei, a satisfactory plating layer can be formed by electroless plating.

Since the printing paste is cured by irradiation of ultraviolet light, the tact time can be shortened, and the problems of dripping during heating and the tact time resulting from heating treatment when a solvent is used can be overcome.

By volatilizing the volatile component after the formation of the pattern with the printing paste or from the resin pattern which has been cured, catalyst particles are forced to be exposed. Therefore, even if the amount of blending of catalyst particles is decreased, electroless plating treatment can be performed efficiently, and the problems that may be caused by high-content blending of catalyst particles are eliminated or alleviated.

Accordingly, the following advantages can be obtained.

(1) The viscosity of the printing paste can be adjusted easily, and a micropattern can be formed with high accuracy.

(2) The amount of the resin component which is a binder can be increased, and thus adhesion between the transparent substrate and the printed pattern, and further adhesion with the conductive pattern can be improved.

(3) The material cost can be reduced by decreasing the amount of blending of expensive catalyst particles.

(4) By decreasing the amount of blending of catalyst particles, the amount of ultraviolet light absorbed by the catalyst particles can be decreased, and thus the irradiation efficiency of ultraviolet light and the curing efficiency can be increased.

As described above, according to the second aspect, when an electromagnetic-wave-shielding light-transmitting window member is produced by a method including the steps of applying, by printing, a resin paste containing an electroless plating catalyst to the surface of a transparent substrate, curing the resulting printed pattern to form a resin pattern, and depositing a plating layer on the resin pattern by electroless plating to form a conductive pattern, by using an ultraviolet-curable resin paste, a good conductive pattern having excellent adhesion to the transparent substrate can be formed with high accuracy, efficiently, and at low cost. The conductive pattern follows the printed pattern, and it is possible to form a conductive pattern with a small line width and a high open area ratio. Therefore, it is possible to easily produce an electromagnetic-wave-shielding light-transmitting window member in which the moire phenomenon can be prevented, and which has significantly high light transmittance, electromagnetic-wave-shielding properties, and heat ray (near-infrared ray) blocking properties.

The second aspect will be described more specifically with reference to examples and comparative examples.

Examples 4 to 6 and Comparative Example 4

First, at the composition shown in Table 2, an acrylate oligomer, an acrylate monomer, and a photoinitiator were stirred for 30 minutes, and then defoaming was performed. Subsequently, palladium fine particles, as electroless plating catalyst particles, and camphor, as a volatile substance, were added thereto, and stirring was performed with a bead mill. (Note that camphor was not added in Example 5 and Comparative Example 4). Then, kneading was performed with a triple roll mill, and filtering was performed with a #300 mesh to prepare a solventless ultraviolet-curable resin paste.

The resulting ultraviolet-curable resin paste was applied by screen printing onto a transparent PET film (100 μm thick), and curing was performed in air at an irradiation intensity of 250 mW and an integrated amount of light of 1,000 mJ. Thereby, a resin pattern with a predetermined lattice pattern (line width: 20 μm, line spacing: 230 μm, thickness: 3 μm) was formed. Subsequently, the volatile substance was volatilized by heating at 80° C. for 10 minutes.

The PET film on which the resin pattern was thus formed was immersed in an electroless copper plating bath ("Cu 5100" manufactured by Meltex Inc.) and electroless copper plating treatment was performed at 50° C. for 20 minutes to form a conductive pattern.

With respect to the resulting conductive pattern, deposition of plating and adhesion were evaluated by the methods described below, and the results thereof are shown in Table 2.

Deposition of plating: The thickness of the plating layer was checked, and also by visually observing the plating layer, the plating layer was evaluated under the following criteria: homogeneous (○), slightly inhomogeneous (Δ), and inhomogeneous (x).

Adhesion of conductive pattern: By a scotch tape peeling test, the adhesion was evaluated under the following criteria: good (○) and poor (x).

As a constituent material of the transparent substrate 21, any material that has excellent erosion resistance to the plating bath and excellent adhesion to the ultraviolet-curable resin paste may be used without particular limitations. Examples thereof include glass, polyesters, polyethylene terephthalate (PET), polybutylene terephthalate, polymethyl

TABLE 2

|  |  | Example | | | Comparative Example |
|---|---|---|---|---|---|
|  |  | 4 | 5 | 6 | 4 |
| Composition of ultraviolet-curable resin paste (Part by weight) | Acrylate oligomer*1 | 100 | 100 | 100 | 100 |
|  | Acrylate monomer *2 | 100 | 100 | 100 | 100 |
|  | Photoinitiator A *3 | 6 | 20 | 0 | 0 |
|  | Photoinitiator B *4 | 0 | 0 | 6 | 6 |
|  | Palladium fine particles *5 | 20 | 20 | 20 | 20 |
|  | Camphor | 20 | 0 | 20 | 0 |
| Deposition of plating | Thickness of plating layer (μm) | 5 | 5 | 5 | Plating material not deposited |
|  | Homogeneity of plating layer | ○ | ○ | ○ |  |
| Adhesion of conductive pattern |  | ○ | ○ | ○ | — |

*1: Acrylate oligomer "UV 2000B" manufactured by Nippon Kayaku Co., Ltd.
*2: Acrylate monomer (2-hydroxy-3-phenoxypropyl acrylate) "R 561" manufactured by Nippon Kayaku Co., Ltd.
*3: α-Aminoketone type photoinitiator "IRGACURE 907" (2-methyl-1[4-(methylthio)phenyl]-2-morpholinopropan-1-one) manufactured by Ciba Specialty Chemicals
*4: α-Hydroxyketone type photoinitiator "IRGACURE 184" (1-hydroxy-cyclohexyl-phenylketone) manufactured by Ciba Specialty Chemicals
*5: Palladium fine particles "AY 4030" manufactured by Takana Kikinzoku Kogyo KK (Average particle size: about 0.1 μm)

As is evident from Table 2, it is possible to form a good conductive pattern by subjecting a resin pattern in which catalyst particles have been exposed by volatilizing a volatile component after ultraviolet curing. In Comparative Example 4, although a volatile photoinitiator is used, the amount used is small, and catalyst particles are not exposed to the surface of the resin pattern. Therefore, a good plating layer cannot be formed.

[3] Next, an electromagnetic-wave-shielding light-transmitting window member and a method for producing the same according to a preferred embodiment of the third aspect will be described with reference to FIGS. 3a to 3e.

Figure 3A:
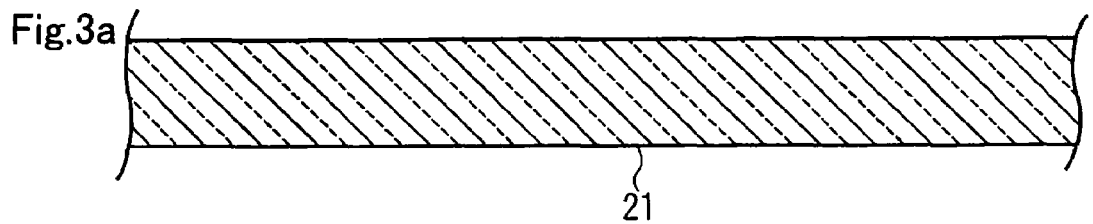
FIGS. 3a to 3e are schematic cross-sectional views showing a method for producing an electromagnetic-wave-shielding light-transmitting window member according to an embodiment of the third aspect.
Figure 3B:
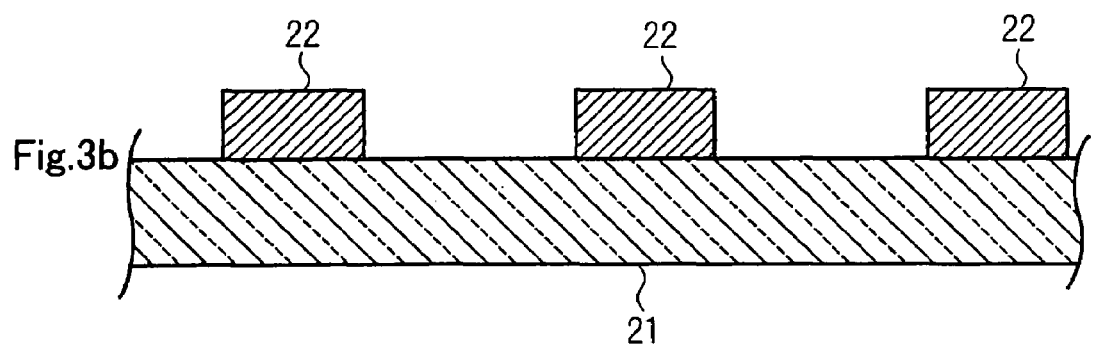
Figure 3C:
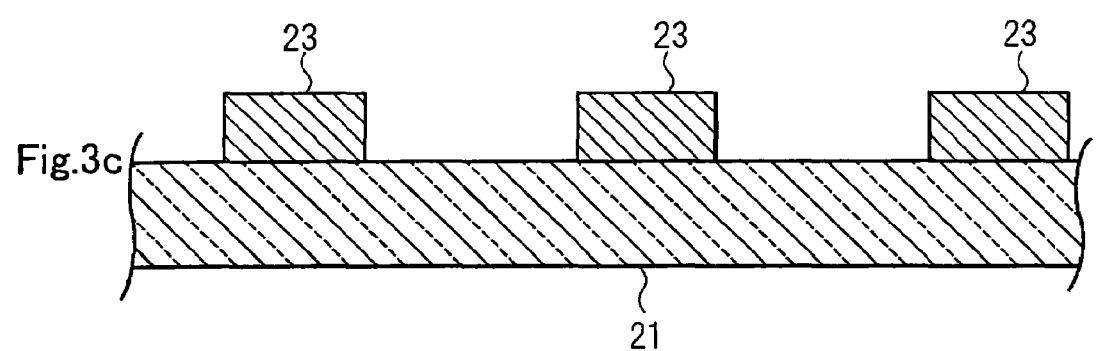

First, a transparent substrate 21 is prepared (FIG. 3a), and a printed pattern 22 composed of an ultraviolet-curable resin paste is formed on a surface of the transparent substrate 21 by a printing method (FIG. 3b). Subsequently, the printed pattern 22 is cured by irradiation of ultraviolet light to form a resin pattern 23 (FIG. 3c).

Figure 3D:
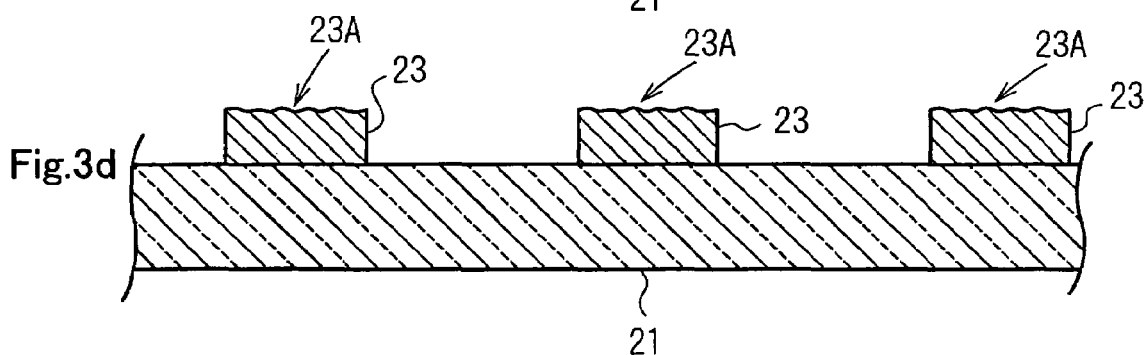
Figure 3E:
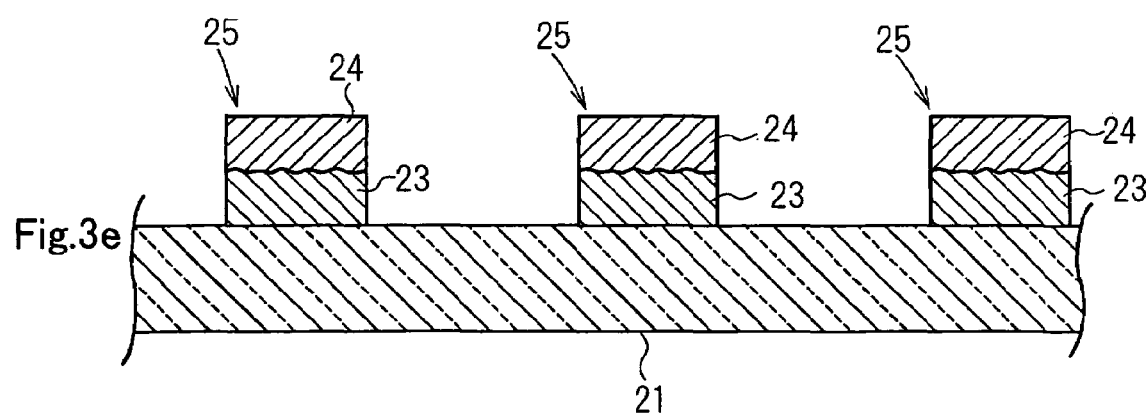

The transparent substrate 21 provided with the resin pattern 23 is subjected to electroless plating treatment. In the electroless plating treatment, when the transparent substrate 21 is immersed in a plating bath, an erosive resin component is eroded by the plating bath and dissolved from the resin pattern 23, or an erosive resin component is impregnated with the plating bath and swells. Thereby, a surface 23A of the resin pattern 23 is roughened, and catalyst particles contained in the ultraviolet-curable resin paste are exposed (FIG. 3d). By performing electroless plating treatment in such a state, an electroless plating layer 24 is formed, using the exposed catalyst particles as nuclei, on the surface 23A to which the catalyst particles have been exposed (FIG. 3e). Thereby, an electromagnetic-wave-shielding light-transmitting window member in which a conductive pattern 25 is disposed on the transparent substrate 11 is obtained.

methacrylate (PMMA), acrylic plates, polycarbonate (PC), polystyrene, triacetate films, polyvinyl alcohol, polyvinyl chloride, polyvinylidene chloride, polyethylene, ethylene-vinyl acetate copolymers, polyvinyl butyral, metal ion crosslinked ethylene-methacrylic acid copolymers, polyurethanes, and cellophane. Particularly preferred are PET, PC, and PMMA.

The thickness of the transparent substrate 21 may be appropriately determined depending on the properties (e.g., strength and lightweightness) required in the application of the resulting window member, and is usually in a range of 1 μm to 5 mm. As the transparent substrate 21, a transparent film with a thickness of about 25 to 200 μm is preferable in view of the reduction in the thickness and weight of the electromagnetic-wave-shielding light-transmitting window member.

The ultraviolet-curable resin paste contains a resin component as a binder, particles of an electroless plating catalyst, and a photoinitiator. The resin component preferably contains an alkali-resistant resin component that ensures adhesion to the transparent substrate 21 and that has excellent erosion resistance to the electroless plating bath after being cured, and an alkali-soluble resin component that is soluble in the plating bath. As the alkali-resistant resin component, a reactive acrylate and/or methacrylate is particularly preferable. The resin component may be a monomer or an oligomer. Preferably, the blending amounts of the monomer and the oligomer and the molecular weight of the oligomer are appropriately adjusted depending on the viscosity required in the ultraviolet-curable resin paste.

As the alkali-soluble resin component, any alkali-soluble resin component that is dissolved from the resin pattern 23 in the plating bath may be used. The alkali-soluble resin component may be a (meth) acrylate monomer having a hydrophilic group that is cured by ultraviolet light, for example, a monomer having a group with high alkali-solubility, such as an ethylene glycol chain, a tertiary amino group, or a morpholino group, or may be a component that is not involved in curing, such as polyethylene glycol. Alternatively, the alkali-soluble resin component may be a resin having an alkali-soluble acidic group, such as a carboxyl group.

As the alkali-soluble resin component, a photosensitive resin which is referred to as a positive resist may be used. Examples thereof include ortho-diazoquinone-novolac resins. In particular, a mixture of a novolac resin and any of ortho-diazonaphthoquinone-5-sulfonic acid esters, esters of trihydroxybenzophenone, and esters of tetrahydroxybenzophenone may be used.

As the alkali-soluble resin component, a photosensitive polyimide resin having, for example, an ortho-nitrobenzyl ester group may be used.

As the alkali-soluble resin component, an electrodepositable photoresist may also be used. Examples of the electrodepositable photoresist material include, but are not limited to, resins having an ortho-naphthoquinonediazide sulfonyl group.

When the resin component in the ultraviolet-curable resin paste is composed of an alkali-resistant resin component and an alkali-soluble resin component, if the ratio of the alkali-soluble resin component to the alkali-resistant resin component is excessively high, the durability of the resin pattern 23 is degraded, and adhesion of the resin pattern 23 and the conductive pattern 25 to the transparent substrate 21 is degraded. If the ratio is low, exposure of catalyst particles becomes insufficient, and it is not possible to form a homogeneous plating layer 24. Consequently, preferably, the alkali-soluble resin component is blended in an amount of 30 to 100 parts by weight, in particular, 50 to 80 parts by weight, based on 100 parts by weight of the alkali-resistant resin component.

The erosive resin component is not limited to the alkali-soluble resin component, and may be a resin component that is impregnated with the plating bath and swells. Examples of such a resin include reactive monomers having a hydrophilic group or a functional group having high alkali-solubility, such as trimethylolpropane triacrylate.

The blending amount of the swelling resin component is preferably substantially the same as that of the alkali-soluble resin component for the same reason as that described above with respect to the alkali-soluble resin component. The swelling resin component and the alkali-soluble resin component may be used together. In such a case, the total amount thereof is preferably substantially the same as the blending amount of the alkali-soluble resin component described above.

As the particles of the electroless plating catalyst, particles of a noble metal, such as Pd, Au, Ag, or Pt; particles of a metal, such as Cu; or particles of a metal oxide, such as ITO (indium tin oxide), may be used. One type of these catalyst particles may be used alone, or two or more types may be combined for use.

The blending amount of the catalyst particles may be appropriately determined depending on the type of the catalyst particles used, and in general, is 10 to 700 parts by weight based on 100 parts by weight of the resin component. Among the catalyst particles, the required amount of Pd is low, for example, about 10 to 50 parts by weight based on 100 parts by weight of the resin component, thus being advantageous in terms of the reduction in the blending amount of the catalyst particles.

If the particle size of the catalyst particles is large, a homogeneous plating layer cannot be obtained. Therefore, the catalyst particles are preferably fine particles with a particle size of 1 µm or less, and in particular, 0.1 µm or less, for example, with an average particle size of about 5 to 500 nm.

The photoinitiator is not particularly limited, and any photoinitiator that is usually employed for ultraviolet-curable resins may be suitably used.

The blending amount of the photoinitiator in the ultraviolet-curable resin paste may be appropriately determined depending on the type of the photoinitiator used and the required ability of curing, and is usually 2 to 10 parts by weight, for example, about 3 to 4 parts by weight, based on 100 parts by weight of the resin component.

As necessary, the ultraviolet-curable resin paste may contain, in addition to the components described above, a dispersing agent, such as a surfactant, in an amount of 0 to about 10 parts by weight based on 100 parts by weight of the resin component.

As necessary, the ultraviolet-curable resin paste may contain a solvent to adjust the viscosity. The amount of the solvent is preferably 0 to about 50 parts by weight based on 100 parts by weight of the resin component. Although a solventless ultraviolet-curable resin paste that includes substantially no solvent can be prepared, a solvent may be used. Even when a solvent is used, it is possible to reduce the blending amount thereof compared with a known general printing paste. Thereby, it is possible to overcome the problems of heat drying treatment after printing, dripping during heating, and tact time (heating time).

As the printing method for applying the ultraviolet-curable resin paste onto the transparent substrate, a screen printing method, an offset printing method, a gravure printing method, a flexographic printing method, or the like may be employed although not limited thereto.

Prior to printing, the ultraviolet-curable resin paste prepared is preferably sieved with a mesh having an adequate opening size to eliminate coarse particles or the like.

The conditions for ultraviolet irradiation to the resulting printed pattern are not particularly limited, and ultraviolet irradiation is performed according to an ordinary method.

After ultraviolet curing is performed, electroless plating treatment is performed. The electroless plating treatment can be performed by an ordinary method using a usual electroless plating bath. Preferred examples of the plating metal, i.e., the conductive material constituting the conductive pattern 25, include metals, such as aluminum, nickel, indium, chromium, gold, vanadium, tin, cadmium, silver, platinum, copper, titanium, cobalt, and zinc, and alloys thereof. Among them, particularly preferred are pure metals of copper, nickel, chromium, zinc, tin, silver, and gold, and alloys thereof. Examples of the electroless plating bath that can be used include an electroless Cu plating bath, an electroless Ni—P plating bath, an electroless Ni—B plating bath, and an electroless Au plating bath.

By the electroless plating treatment, the plating metal is deposited using the electroless plating catalyst particles as nuclei, the catalyst particles being exposed to the surface 23A because of dissolving of the alkali-soluble resin component or the like from the resin pattern 23, and thereby the plating layer 24 is formed.

If the thickness of the plating layer 24 of the conductive pattern 25 thus formed is excessively small, the electromagnetic-wave-shielding property is insufficient, which is not desirable. If the thickness of the plating layer 24 is excessively large, the thickness of the resulting electromagnetic-wave-shielding light-transmitting window member is affected, and the angle of view is narrowed. Furthermore, since the plating extends also in the width length, the line width increases, resulting in a decrease in the open area ratio. The thickness of the plating layer 24 is preferably about 0.1 to 10 μm.

After the conductive pattern 25 is formed by electroless plating, in order to impart anti-glare properties, blackening treatment may be performed. Examples of the blackening technique that may be used include oxidation treatment for the metal film and black plating treatment using a chromium alloy or the like.

Desirably, the conductive pattern 25 thus formed has a lattice shape having a line width of preferably 200 μm or less, particularly preferably 100 μm or less, and most preferably 30 μm or less, and an open area ratio of 75% or more. Consequently, the ultraviolet-curable resin paste is preferably pattern-printed so that such a conductive pattern 25 can be formed.

In particular, when a transparent film is used as the substrate, the electromagnetic-wave-shielding light-transmitting window member thus produced may be a sheet film or a continuous web film wound off a roll.

In the third aspect, ultraviolet-curable resin paste for forming the resin pattern contains erosive resin components, and since the erosive resin components are dissolved out or impregnated with the plating bath and swell during the electroless plating treatment, particles of the electroless plating catalyst in the resin pattern are exposed to the surface of the resin pattern. Using, as nuclei, the catalyst particles exposed because of erosion of the surface of the resin pattern in the plating bath, a satisfactory plating layer can be formed by electroless plating.

Since the printing paste is can be cured by irradiation of ultraviolet light, the problems of dripping during heating and the tact time resulting from heat treatment when a solvent is used can be overcome.

By eroding the surface layer of the resin pattern in the plating bath, catalyst particles are forced to be exposed. Therefore, even if the amount of blending of catalyst particles is decreased, electroless plating treatment can be performed efficiently, and the problems that may be caused by high-content blending of catalyst particles are eliminated or alleviated.

Accordingly, the following advantages can be obtained.

(1) The viscosity of the printing paste can be adjusted easily, and a micropattern can be formed with high accuracy.

(2) The amount of the resin component which is a binder can be increased, and thus adhesion between the transparent substrate and the printed pattern, and further adhesion with the conductive pattern can be improved.

(3) The material cost can be reduced by decreasing the amount of blending of expensive catalyst particles.

(4) By decreasing the amount of blending of catalyst particles, the amount of ultraviolet light absorbed by the catalyst particles can be decreased, and thus the irradiation efficiency of ultraviolet light and the curing efficiency can be increased.

As described above, according to the third aspect, when an electromagnetic-wave-shielding light-transmitting window member is produced by a method including the steps of applying, by pattern printing, a resin paste containing an electroless plating catalyst to the surface of a transparent substrate, curing the resulting printed pattern to form a resin pattern, and depositing a plating layer on the resin pattern by electroless plating to form a conductive pattern, by using an ultraviolet-curable resin paste, a good conductive pattern having excellent adhesion to the transparent substrate can be formed with high accuracy, efficiently, and at low cost. The conductive pattern follows the printed pattern, and it is possible to form a conductive pattern with a small line width and a high open area ratio. Therefore, it is possible to easily produce an electromagnetic-wave-shielding light-transmitting window member in which the moire phenomenon can be prevented, and which has significantly high light transmittance, electromagnetic-wave-shielding properties, and heat ray (near-infrared ray) blocking properties.

The third aspect will be described more specifically with reference to examples and comparative examples.

Examples 7 to 13 and Comparative Examples 5 to 8

First, at the composition shown in Table 3, resin components and a photoinitiator were stirred for 30 minutes, and then defoaming was performed. Subsequently, palladium fine particles as electroless plating catalyst particles were added thereto, and stirring was performed with a bead mill. Then, kneading was performed with a triple roll mill, and filtering was performed with a #300 mesh to prepare a solventless ultraviolet-curable resin paste.

The resulting ultraviolet-curable resin paste was applied by screen printing onto a transparent PET film (100 μm thick), and curing was performed in air at an irradiation intensity of 250 mW and an integrated amount of light of 1,000 mJ. Thereby, a resin pattern with a predetermined lattice pattern (line width: 20 μm, line spacing: 230 μm, thickness: 3 μm) was formed.

The PET film on which the resin pattern was thus formed was immersed in an electroless copper plating bath ("Cu 5100" manufactured by Meltex Inc.) and electroless copper plating treatment was performed at 50° C. for 20 minutes to form a conductive pattern.

With respect to the resulting conductive pattern, deposition of plating and adhesion were evaluated by the methods described below, and the results thereof are shown in Table 3.

Deposition of plating: The thickness of the plating layer was checked, and also by visually observing the plating layer, the plating layer was evaluated under the following criteria: very homogeneous (⊚), homogeneous (○), slightly inhomogeneous (Δ), and inhomogeneous (x).

Adhesion of conductive pattern: By a scotch tape peeling test, the adhesion was evaluated under the following criteria: very good (⊚), good (○), and poor (x).

TABLE 3

| | | | Example | | | | | | | Comparative Example | | | |
|---|---|---|---|---|---|---|---|---|---|---|---|---|---|
| | | | 7 | 8 | 9 | 10 | 11 | 12 | 13 | 5 | 6 | 7 | 8 |
| Composition of ultraviolet-curable resin paste (Part by weight) | Resin composition | Acrylate oligomer *1 | 100 | 100 | 100 | 50 | 100 | 100 | 100 | 100 | 100 | 100 | 100 |
| | | Morpholine acrylate *2 | 100 | 50 | | 100 | | | | 20 | 200 | | |
| | | 2-Hydroxyethyl acrylate *3 | | | 100 | | | | | | | | |
| | | Ethoxylated trimethylolpropane triacrylate *4 | | | | | 100 | | | | | | |
| | | 2-Hydroxy-3-phenoxypropyl acrylate *5 | | | | | | 100 | 100 | | | 100 | |
| | | Bifunctional epoxy acrylate *6 | | | | 50 | | | | | | | 100 |
| | | Polyethylene glycol *7 | | | | | | 60 | | | | | |
| | | Carboxyl group-introduced acrylic oligomer *8 | | | | | | | 60 | | | | |
| | Photoinitiator *9 | | 6 | 4.5 | 6 | 6 | 6 | 6 | 6 | 3.6 | 9 | 6 | 6 |
| | Palladium fine particles *10 | | 20 | 15 | 20 | 20 | 20 | 20 | 20 | 12 | 30 | 20 | 20 |
| Deposition of plating | Thickness of plating layer (μm) | | 10 | 5 | 5 | 10 | 5 | 5 | 5 | 5 | 10 | 0 | 0 |
| | Homogeneity of plating layer | | ⊚ | ○ | ○ | ⊚ | ⊚ | ○ | ○ | Δ | ⊚ | X | X |
| | Adhesion of conductive pattern | | ○ | ⊚ | ○ | ⊚ | ○ | ○ | ⊚ | ⊚ | X | ⊚ | ⊚ |

*1: Acrylate oligomer "UV 2000B" manufactured by Nippon Kayaku Co., Ltd.
*2: Morpholine acrylate "Rm 1001" manufactured by Nippon Kayaku Co., Ltd.
*3: 2-Hydroxyethyl acrylate "HOA" manufactured by Kyoei Kagaku KK
*4: Ethoxylated trimethylolpropane triacrylate "SR 502" manufactured by Nippon Kayaku Co., Ltd.
*5: 2-Hydroxy-3-phenoxypropyl acrylate "R 561" manufactured by Nippon Kayaku Co., Ltd.
*6: Bifunctional epoxy acrylate "R 381" manufactured by Nippon Kayaku Co., Ltd.
*7: Polyethylene glycol (Mw = 380 to 420) "PEG #400" manufactured by Kanto Chemical Co., Inc.
*8: Carboxyl group-introduced acrylic oligomer "CBB 3098" manufactured by Soken Chemical & Engineering Co., Ltd.
*9: α-Aminoketone type photoinitiator "IRGACURE 907" (2-methyl-1[4-(methylthio)phenyl]-2-morpholinopropan-1-one) manufactured by Ciba Specialty Chemicals
*10: Palladium fine particles "AY 4030" manufactured by Takana Kikinzoku Kogyo KK (Average particle size: about 0.1 μm)

As is evident from Table 3, it is possible to form a good conductive pattern by subjecting a resin pattern formed of an ultraviolet-curable resin paste containing a moderate amount of an alkali-soluble resin component.

The invention claimed is:

1. A method for producing an electromagnetic-wave-shielding light-transmitting window member comprising a transparent substrate and a conductive pattern formed by electroless plating on a surface of the transparent substrate, the method comprising the steps of:
    applying, by printing, an ultraviolet-curable resin paste containing an electroless plating catalyst to the surface of the transparent substrate;
    curing the resulting printed pattern by irradiation of ultraviolet light to form a resin pattern having the same pattern as the conductive pattern; and
    subsequently depositing a conductive material on the resin pattern by electroless plating treatment to form the conductive pattern,
    wherein the ultraviolet-curable resin paste contains a volatile substance that sublimates by irradiation of ultraviolet light; after the resin pattern is formed, the volatile component sublimates from the resin pattern to expose particles of the electroless plating catalyst on the surface of the resin pattern; and then the electroless plating treatment is carried out,
    wherein the UV light sublimable volatile substance is at least one material selected from the group consisting of sublimable resists and phthalocyanine-based sublimable materials.

2. The method for producing the electromagnetic-wave-shielding light-transmitting window member according to claim 1, wherein the ultraviolet-curable resin paste further contains a photoinitiator, and the content of the electroless plating catalyst is 10 to 700 parts by weight based on 100 parts by weight of the resin component, the content of the photoinitiator is 2 to 10 parts by weight based on 100 parts by weight of the resin component, and the content of the volatile substance is 10 to 100 parts by weight based on 100 parts by weight of the resin component.

3. The method for producing the electromagnetic-wave-shielding light-transmitting window member according to claim 1, wherein the thickness of the resulting plating layer is 0.1 to 10 μm.

4. The method for producing the electromagnetic-wave-shielding light-transmitting window member according to claim 1, wherein the resin pattern is formed in a lattice shape.

5. The method for producing the electromagnetic-wave-shielding light-transmitting window member according to claim 4, wherein the conductive pattern has a line width of 30 μm to 200 μm and an open area ratio of 75% or more.

* * * * *